(12) United States Patent
Seitz

(10) Patent No.: US 7,187,612 B2
(45) Date of Patent: Mar. 6, 2007

(54) MEMORY HAVING POWER-UP CIRCUIT

(75) Inventor: Helmut Seitz, Essex Junction, VT (US)

(73) Assignee: Infineon Technologies AG, Munich (DE)

( * ) Notice: Subject to any disclaimer, the term of this patent is extended or adjusted under 35 U.S.C. 154(b) by 120 days.

(21) Appl. No.: 11/118,037

(22) Filed: Apr. 29, 2005

(65) Prior Publication Data

US 2006/0245273 A1    Nov. 2, 2006

(51) Int. Cl.
*G11C 5/14*    (2006.01)
(52) U.S. Cl. .................. 365/226; 365/189.09; 327/534
(58) Field of Classification Search ........... 365/189.09, 365/226, 227–229; 327/382, 534, 535
See application file for complete search history.

(56) References Cited

U.S. PATENT DOCUMENTS

| 5,329,168 | A | * | 7/1994 | Sugibayashi et al. ....... 327/535 |
| 5,469,387 | A | | 11/1995 | Kim |
| 6,205,061 | B1 | | 3/2001 | Surlekar et al. |
| 6,343,044 | B1 | * | 1/2002 | Hsu et al. .................... 365/227 |

* cited by examiner

*Primary Examiner*—VanThu Nguyen
(74) *Attorney, Agent, or Firm*—Dicke, Billig & Czaja, PLLC

(57) ABSTRACT

A memory includes a power-up circuit configured to increase a first voltage to a first value with a second voltage tied to ground, reduce the first voltage from the first value to a second value with the second voltage floating to reduce the second voltage through a parasitic coupling capacitance, and pump the second voltage to reduce the second voltage to a third value with the first voltage less than the second value.

32 Claims, 5 Drawing Sheets

MEMORY HAVING POWER-UP CIRCUIT

BACKGROUND

Dynamic Random Access Memory (DRAM) typically uses several voltages that are generated internally to the DRAM. Some of the voltages are regulated out of the supply voltage VDD or Vint, if they are within the range VDD–VSS. Voltages with targets outside of the range VDD–VSS are typically pumped either out of VDD for a voltage higher than VDD (e.g., boosted word line voltage (VPP)) or out of VSS for a voltage lower than VSS (e.g., back bias voltage (VBB) for the array transistor).

The negative word line low voltage (VNWLL), which is the negative voltage for the word lines, and VBB are typically generated independently. The requirements for VNWLL and VBB are inverse. During power-up, VBB requires large drive capability for charging large parasitic decoupling capacitances between VBB and the plate voltage (VPL), between VBB and the bit line equalization voltage (VBLEQ), and between VBB and VNWLL. After power-up, VBB requires small drive capability since no significant leakage occurs. During power-up, VNWLL requires a small drive capability for charging parasitic decoupling capacitances between VNWLL and VBLEQ and between VNWLL and VBB. After power-up, VNWLL requires large drive capability for precharging the word lines during the active state.

The main task during power-up is to optimize the VPL and VBLEQ ramps to positive voltages and the VBB and VNWLL ramps to negative voltages within the defined specification of 200 µs for commodity DRAM or 150 µs for CellularRAM for every value of VDD, process case variation, and temperature. During power up, the capacitance network between VPL, VBLEQ, VBB, and VNWLL is charged. VPL and VBLEQ are charged on the positive side, and VBB and VNWLL are charged on the negative side. Because of the capacitance coupling, any rise in VPL or VBLEQ raises VBB and VNWLL to positive voltages with VBB or VNWLL floating. Therefore, typical DRAM includes discharge devices that limit any potential increase of VBB and VNWLL. Typically, VPL and VBLEQ operate with reduced drive capability during power-up in order to limit any VBB or VNWLL increase. This reduced drive capability during power-up, however, may result in a longer power-up time.

Typically, DRAM chips have an independent pump system for VBB and VNWLL and discharge devices to limit any potential VBB or VNWLL increase. In addition, the drive capability for VPL and VBLEQ may be adjusted to limit any potential VBB or VNWLL increase. For typical DRAM chips, several VBB pumps are needed for power-up, but after power-up only a small VBB pump is needed to balance the small leakage. Typical DRAM chips use a large chip area for the several VBB pumps and discharge devices that are only used during power-up.

SUMMARY

One embodiment of the present invention provides a memory. The memory includes a power-up circuit configured to increase a first voltage to a first value with a second voltage tied to ground, reduce the first voltage from the first value to a second value with the second voltage floating to reduce the second voltage through a parasitic coupling capacitance, and pump the second voltage to reduce the second voltage to a third value with the first voltage less than the second value.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
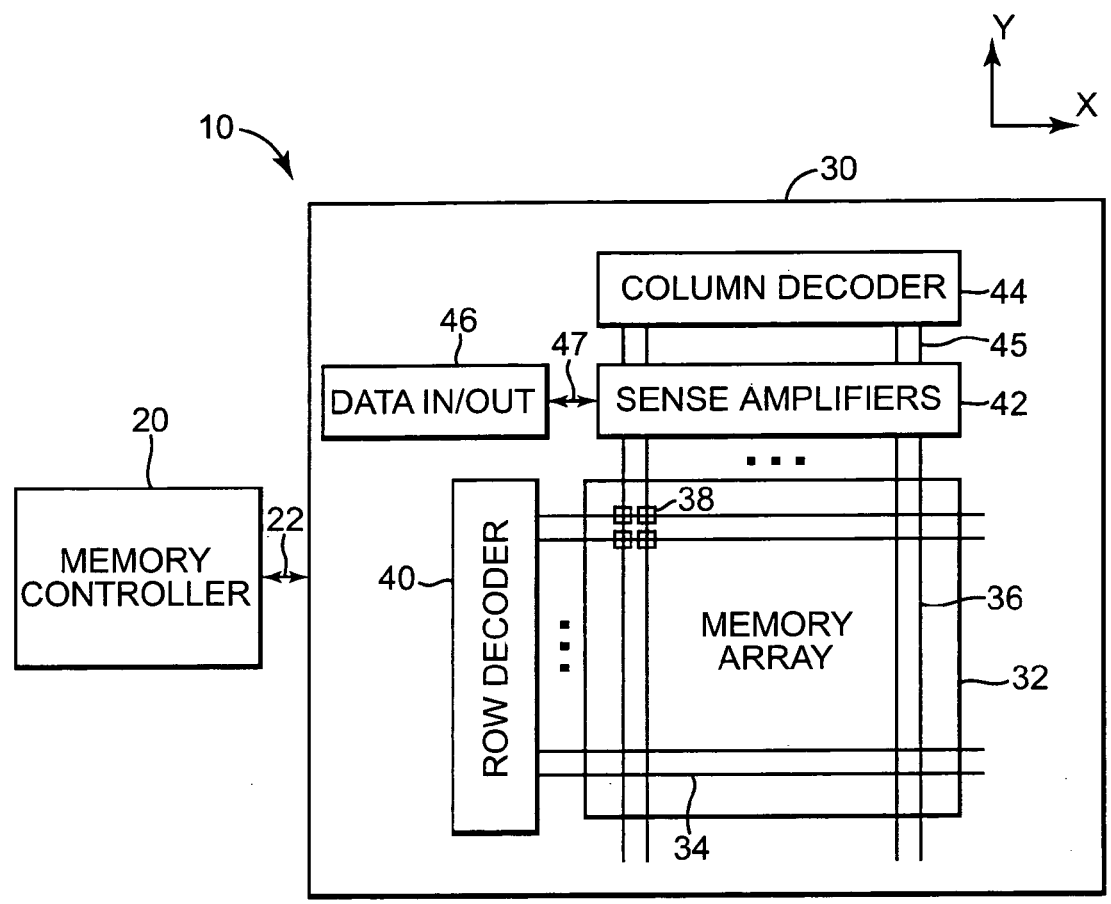
FIG. 1 is a block diagram illustrating one embodiment of a random access memory, according to the present invention.

FIG. 1 is a block diagram illustrating one embodiment of a random access memory 10. In one embodiment, random access memory 10 is a Dynamic Random Access Memory (DRAM). DRAM 10 includes a memory controller 20 and at least one memory bank 30. Memory bank 30 includes an array of memory cells 32, a row decoder 40, a column decoder 44, sense amplifiers 42, and data in/out circuit 46. Memory controller 20 is electrically coupled to memory bank 30 through communication link 22.

DRAM 10 is configured for an efficient and quick power-up by using the parasitic coupling capacitances of memory cells 38 as a charge pump. At power-up, the parasitic coupling capacitances of memory cells 38 are charged. To begin, the capacitor plate voltage (VPL) and the bit line equalization voltage (VBLEQ) are ramped up with the array transistor back bias voltage (VBB) and the negative word line low voltage (VNWLL) tied to ground. VPL and VBLEQ are ramped up to values higher than a target value. Next, VPL and VBLEQ are reduced to the target value with VBB and VNWLL floating. With VBB and VNWLL floating, VBB and VNWLL decrease by the same amount as VPL and VBLEQ through the parasitic coupling capacitance to provide a fast ramp of VBB and VNWLL. Once VPL and VBLEQ are reduced to the target value, VBB and VNWLL pumps are started to reduce VBB and VNWLL to their target values.

Conductive word lines 34, referred to as row select lines, extend in the x-direction across the array of memory cells 32. Conductive bit lines 36 extend in the y-direction across the array of memory cells 32. A memory cell 38 is located at each cross point of a word line 34 and a bit line 36. Each word line 34 is electrically coupled to row decoder 40, and each bit line 36 is electrically coupled to a sense amplifier 42. The sense amplifiers 42 are electrically coupled to column decoder 44 through conductive column decoder lines 45 and to data in/out circuit 46 through data lines 47.

Data in/out circuit 46 includes a plurality of latches and data input/output (I/O) pads or pins (DQs) to transfer data between memory bank 30 and an external device. Data to be written into memory bank 30 is presented as voltages on the DQs from an external device. The voltages are translated into the appropriate signals and stored in selected memory cells 38. Data read from memory bank 30 is presented by memory bank 30 on the DQs for an external device to retrieve. Data read from selected memory cells 38 appears at the DQs once access is complete and the output is enabled. At other times, the DQs are in a high impedance state.

Memory controller 20 controls reading data from and writing data to memory bank 30. During a read operation, memory controller 20 passes the row address of a selected memory cell or cells 38 to row decoder 40. Row decoder 40 activates the selected word line 34. As the selected word line 34 is activated, the value stored in each memory cell 38 coupled to the selected word line 34 is passed to the respective bit line 36. The value of each memory cell 38 is read by a sense amplifier 42 electrically coupled to the respective bit line 36. Memory controller 20 passes a column address of the selected memory cell or cells 38 to column decoder 44. Column decoder 44 selects which sense amplifiers 42 pass data to data in/out circuit 46 for retrieval by an external device.

During a write operation, the data to be stored in array 32 is placed in data in/out circuit 46 by an external device. Memory controller 20 passes the row address for the selected memory cell or cells 38 where the data is to be stored to row decoder 40. Row decoder 40 activates the selected word line 34. Memory controller 20 passes the column address for the selected memory cell or cells 38 where the data is to be stored to column decoder 44. Column decoder 44 selects which sense amplifiers 42 are passed the data from data in/out circuit 46. Sense amplifiers 42 write the data to the selected memory cell or cells 38 through bit lines 36.

Figure 2:
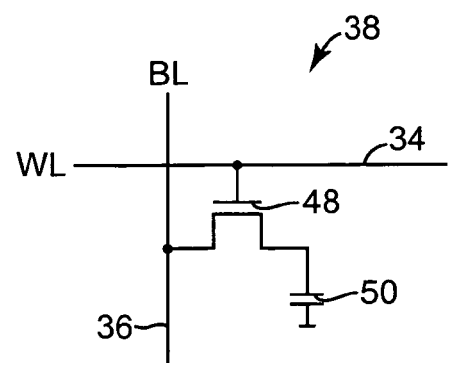
FIG. 2 is a diagram illustrating one embodiment of a memory cell.

FIG. 2 is a diagram illustrating one embodiment of one memory cell 38 in the array of memory cells 32. Memory cell 38 includes a transistor 48 and a capacitor 50. The gate of transistor 48 is electrically coupled to word line (WL) 34. The drain-source path of transistor 48 is electrically coupled to bit line (BL) 36 and capacitor 50. Capacitor 50 is charged to represent either a logic "0" or a logic "1". During a read operation, word line 34 is activated to turn on transistor 48 and the value stored on capacitor 50 is read by a corresponding sense amplifier 42 through bit line 36 and transistor 48. During a write operation, word line 34 is activated to turn on transistor 48 and the value stored on capacitor 50 is written by a corresponding sense amplifier 42 through bit line 36 and transistor 48.

The read operation on memory cell 38 is a destructive read operation. After each read operation, capacitor 50 is recharged with the value that was just read. In addition, even without read operations, the charge on capacitor 50 discharges over time. To retain a stored value, memory cell 38 is refreshed periodically by reading or writing the memory cell 38. All memory cells 38 within the array of memory cells 32 are periodically refreshed to maintain their values.

In one embodiment, random access memory 10 is a Double Data Rate Synchronous Dynamic Random Access Memory (DDR SDRAM), DDR-II SDRAM, or DDR-III SDRAM. In another, embodiment, random access memory 10 is a Pseudo Static Random Access Memory (PSRAM). One type of PSRAM is CellularRAM™, which is adapted for wireless applications. CellularRAM is a drop-in replacement for Static Random Access Memory (SRAM) and is based on a single transistor DRAM cell versus a six transistor SRAM cell. In another embodiment, random access memory 10 is a low power SDRAM, which is also known as mobile random access memory (Mobile-RAM). Mobile-RAM is a low power synchronous DRAM designed especially for mobile applications, such as cellular telephones, personal digital assistants (PDAs), handheld computers, etc.

In one embodiment, DRAMs use a number of voltages to operate including a supply voltage (VDD or Vint), a common voltage (VSS), a bit line high voltage (VBLH), a boosted word line voltage (VPP), an array transistor back bias voltage (VBB), an array plate voltage (VPL), a bit line equalization voltage in standby mode (VBLEQ), and a negative word line low voltage (VNWLL). VBLH is the voltage applied to a bit line 36 for setting a memory cell to a logic "1". VPP is the voltage applied to a word line 34 for setting a memory cell to a logic "1". VPP is greater than VBLH plus an array device threshold voltage (VTarray) to write VBLH into a memory cell. VBB is used to suppress subthreshold leakage of the array device and the vertical parasitic trench transistor. VBB also provides fine tuning of the array device threshold voltage and decreases bit line capacitance. VPL is equal to VBLH/2. VPL reduces node dielectric stress and provides a symmetric cell capacitance for a logic "1" and a logic "0". VBLEQ equals VBLH/2. VBLEQ provides a reference voltage for the sense amplifiers in standby mode. VNWLL reduces the array device subthreshold leakage.

Figure 3:
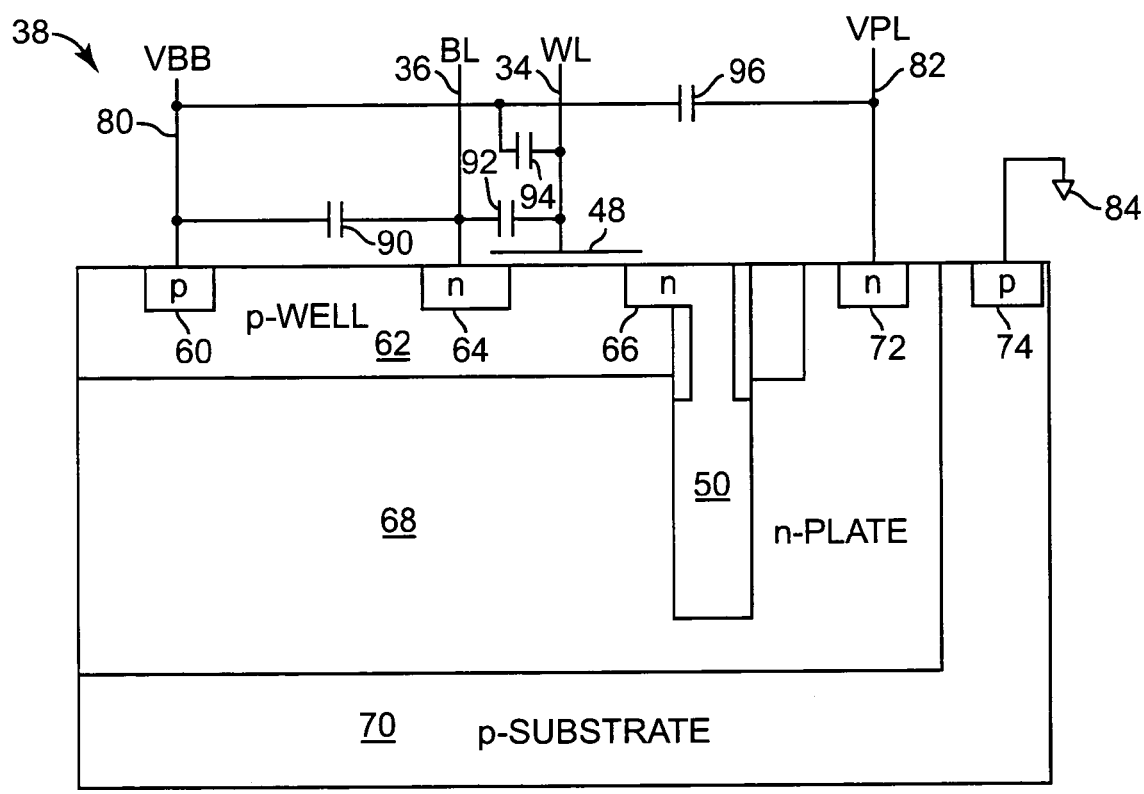
FIG. 3 is a diagram illustrating one embodiment of the memory cell including parasitic coupling capacitances.

FIG. 3 is a diagram illustrating one embodiment of memory cell 38 including parasitic coupling capacitances 90, 92, 94, and 96. Memory cell 38 is fabricated on a wafer and includes p-doped well 62, n-doped plate 68, p-doped substrate 70, p-doped regions 60 and 74, n-doped regions 64, 66, and 72, deep trench capacitor 50, and transistor 48. P-doped region 74 couples p-doped substrate 70 to ground 84. VBB signal path 80 is electrically coupled to p-doped well 62 through p-doped region 60 to provide a back bias voltage for transistor 48. BL 36 is electrically coupled to n-doped region 64, which provides one side of the drain-source path of transistor 48. WL 34 is electrically coupled to the gate of transistor 48. VPL signal path 82 is electrically coupled to n-doped region 72 to provide a plate voltage for capacitor 50.

Capacitor 90 represents the parasitic coupling capacitance between p-doped well 62 and n-doped region 64 or VBB signal path 80 and BL 36. Capacitor 92 represents the parasitic coupling capacitance between n-doped region 64 and the gate of transistor 48 or BL 36 and WL 34. Capacitor 94 represents the parasitic coupling capacitance between p-doped well 62 and the gate of transistor 48 or VBB signal path 80 and WL 34. Capacitor 96 represents the parasitic coupling capacitance between p-doped well 62 and n-doped plate 68 or VBB signal path 80 and VPL signal path 82.

At power-up, capacitor 90 is charged by voltages VBB on VBB signal path 80 and VBLEQ on BL 36. Capacitor 92 is charged by voltages VBLEQ on BL 36 and VNWLL on WL 34. Capacitor 94 is charged by voltages VBB on VBB signal path 80 and VNWLL on WL 34. Capacitor 96 is charged by voltages VBB on VBB signal path 80 and VPL on VPL signal path 82.

In one embodiment, after power-up VBB equals approximately −0.15V and VPL equals approximately 0.75V. In one embodiment, VBLEQ on BL 36 equals approximately 0.75V during standby and VBLH on BL 36 equals approximately 1.5V or ground during the active state. In one embodiment, VNWLL on WL 34 equals approximately −0.5V during standby and VPP on WL 34 equals approximately 2.9V during the active state.

Figure 4:
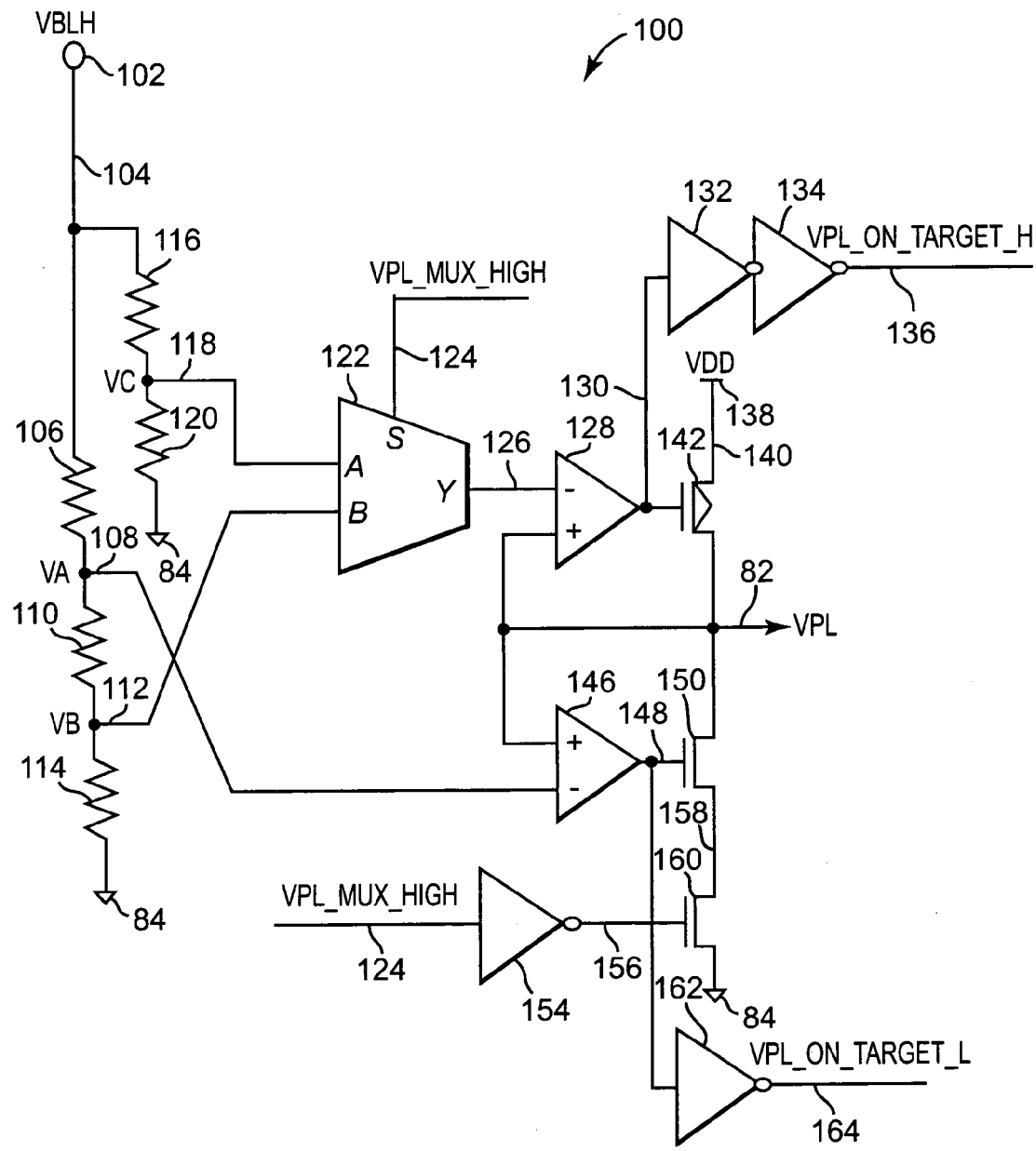
FIG. 4 is a diagram illustrating one embodiment of a voltage driver circuit.

FIG. 4 is a diagram illustrating one embodiment of a voltage driver circuit 100. In one embodiment, voltage driver circuit 100 is part of memory controller 20. Although voltage driver circuit 100 illustrates a circuit for driving a VPL signal, a similar circuit is used for driving a VBLEQ signal. In one embodiment, a single voltage driver circuit 100 is used to provide both VPL and VBLEQ. Voltage driver circuit 100 includes resistors 106, 110, 114, 116, and 120, multiplexer (MUX) 122, comparators 128 and 146, inverters 132, 134, 154, and 162, and transistors 142, 150, and 160.

VBLH 102 is electrically coupled to one side of resistor 106 and one side of resistor 116 through signal path 104. The other side of resistor 106 is electrically coupled to one side of resistor 110 and the negative input of comparator 146 through Voltage A (VA) signal path 108. The other side of resistor 110 is electrically coupled to one side of resistor 114 and input B of MUX 122 through Voltage B (VB) signal path 112. The other side of resistor 114 is electrically coupled to ground 84.

The other side of resistor 116 is electrically coupled to one side of resistor 120 and input A of MUX 122 through Voltage C (VC) signal path 118. The other side of resistor 120 is electrically coupled to ground 84. Select input S of MUX 122 receives the plate voltage multiplexer high (VPL_MUX_HIGH) signal on VPL_MUX_HIGH signal path 124. Output Y of MUX 122 is electrically coupled to the negative input of comparator 128 through signal path 126. The positive input of comparator 128 is electrically coupled to the positive input of comparator 146, one side of the drain-source path of transistor 142, and one side of the drain-source path of transistor 150 through VPL signal path 82. The output of comparator 128 is electrically coupled to the input of inverter 132 and the gate of transistor 142 through signal path 130. The output of inverter 132 is electrically coupled to the input of inverter 134. The output of inverter 134 provides the plate voltage on target high (VPL_ON_TARGET_H) signal on VPL_ON_TARGET_H signal path 136.

The other side of the drain-source path of transistor 142 is electrically coupled to VDD 138 through signal path 140. The output of comparator 146 is electrically coupled to the gate of transistor 150 and the input of inverter 162 through signal path 148. The output of inverter 162 provides the plate voltage on target low (VPL_ON_TARGET_L) signal on VPL_ON_TARGET_L signal path 164. The other side of the drain-source path of transistor 150 is electrically coupled to one side of the drain-source path of transistor 160 through signal path 158. The input of inverter 154 receives the VPL_MUX_HIGH signal on VPL_MUX HIGH signal path 124. The output of inverter 154 is electrically coupled to the gate of transistor 160 through signal path 156. The other side of the drain-source path of transistor 160 is electrically coupled to ground 84.

Resistors 106, 110, and 114 provide a voltage divider to divide VBLH 102 to provide the VA signal on VA signal path 108 and the VB signal on VB signal path 118. Resistors 116 and 120 provide a voltage divider to divide VBLH 102 to provide the VC signal on VC signal path 118. In one embodiment, the VC signal is greater than the VA signal, and the VA signal is greater than the VB signal.

MUX 122 receives the VC signal on VC signal path 118, the VB signal on VB signal path 112, and the VPL_MUX_HIGH signal on VPL_MUX_HIGH signal path 124 to provide a signal on signal path 126. In response to a logic high VPL_MUX_HIGH signal, MUX 122 passes the VC signal to signal path 126. In response to a logic low VPL_MUX_HIGH signal, MUX 122 passes the VB signal to signal path 126.

Comparator 128 receives the signal on signal path 126 and the VPL signal on VPL signal path 182 to provide a signal on signal path 130. In response to the signal on signal path 126 being greater than the VPL signal, comparator 128 outputs a logic low signal on signal path 130. In response to the signal on signal path 126 being less than the VPL signal, comparator 128 outputs a logic high signal on signal path 130.

Comparator 146 receives the VPL signal on VPL signal path 82 and the VA signal on VA signal path 108 to provide a signal on signal path 148. In response to the VPL signal being greater than the VA signal, comparator 146 outputs a logic high signal on signal path 148. In response to the VPL signal being less than the VA signal, comparator 146 outputs a logic low signal on signal path 148.

Inverter 132 inverts the signal on signal path 130 to provide an output signal. Inverter 134 inverts the output signal from inverter 132 to provide the VPL_ON_TARGET_H signal on VPL_ON_TARGET_H signal path 136. Inverter 154 inverts the VPL_MUX_HIGH signal on VPL_MUX_HIGH signal path 124 to provide the signal on signal path 156. Inverter 162 inverts the signal on signal path 148 to provide the VPL_ON_TARGET_L signal on VPL_ON_TARGET_L signal path 164.

In one embodiment, transistor 142 is a p-channel metal-oxide-semiconductor field effect transistor or other suitable transistor. In response to a logic high signal on signal path 130, transistor 142 turns off. In response to a logic low signal on signal path 130, transistor 142 turns on to raise the VPL signal.

In one embodiment, transistors 150 and 160 are n-channel metal-oxide-semiconductor field effect transistors or other suitable transistors. In response to a logic high signal on signal path 148, transistor 150 turns on. In response to a logic low signal on signal path 148, transistor 150 turns off. In response to a logic high signal on signal path 156, transistor 160 turns on. In response to a logic low signal on signal path 156, transistor 160 turns off. With both transistor 150 and transistor 160 turned on, the VPL signal is lowered.

In operation, before power-up of DRAM 10, voltage driver circuit 100 is disabled (disable circuit not shown). With voltage driver circuit 100 disabled, the VPL signal equals zero volts, the VPL_ON_TARGET_H signal is logic low, the VPL_ON_TARGET_L signal is logic low, and the VPL_MUX_HIGH signal is logic high. Upon power-up of DRAM 10, VPL driver circuit 100 is enabled. With the VPL_MUX_HIGH signal logic high, MUX 122 passes the VC signal to signal path 126. With the VPL signal less than the VC signal, VPL driver circuit 100 raises the VPL signal through transistor 142. With the VPL signal greater than the VC signal, the VPL_ON_TARGET-H signal transitions to logic high and the VPL_MUX_HIGH signal transitions to logic low as described in further detail below with reference to FIG. 5.

With the VPL_MUX_HIGH signal logic low, MUX 122 passes the VB signal to signal path 126. With the VPL signal greater than the VA signal, VPL driver circuit 100 lowers the VPL signal through transistors 150 and 160. With the VPL signal less than the VA signal, the VPL_ON_TARGET_L signal transitions to logic high. VPL driver circuit 100 then maintains the VPL signal between the VA signal and the VB signal through transistors 142 and 150.

Figure 5:
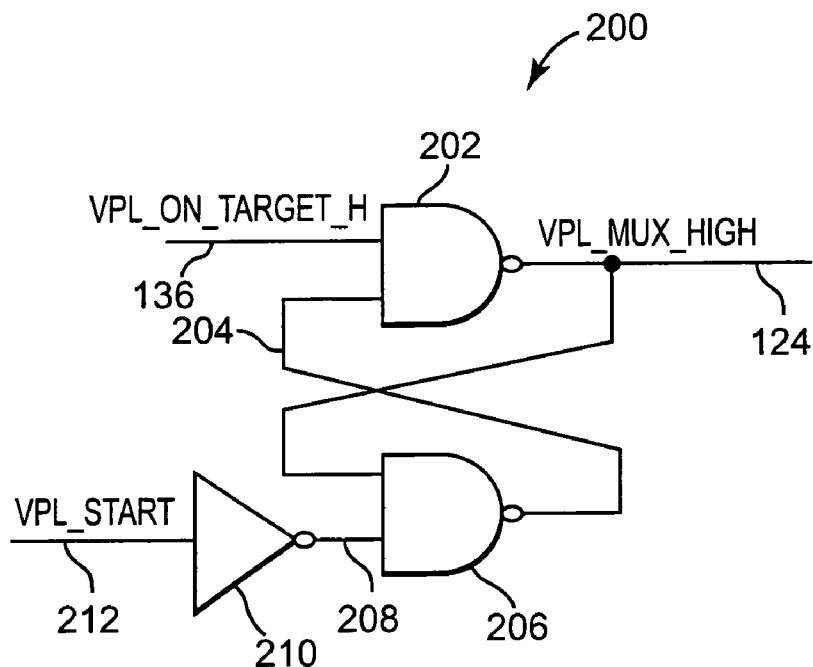
FIG. 5 is a diagram illustrating one embodiment of a control circuit for the voltage driver circuit.

FIG. 5 illustrates one embodiment of a control circuit 200 for voltage driver circuit 100. In one embodiment, control circuit 200 is part of memory controller 20. Control circuit 200 includes NAND gates 202 and 206 and inverter 210. A first input of NAND gate 202 receives the VPL_ON_TARGET_H signal on VPL_ON_TARGET_H signal path 136. A second input of NAND gate 202 is electrically coupled to the output of NAND gate 206 through signal path 204. The output of NAND gate 202 is electrically coupled to a first input of NAND gate 206 through VPL_MUX_HIGH signal path 124. Inverter 210 receives the plate voltage start (VPL_START) signal on VPL_START signal path 212. The output of inverter 210 is electrically coupled to the second input of NAND gate 206 through signal path 208.

In response to a logic high signal on VPL_ON_TARGET_H signal path 136 and a logic high signal on signal path 204, NAND gate 202 outputs a logic low VPL_MUX_HIGH signal on VPL_MUX_HIGH signal path 124. In response to a logic low signal on VPL_ON_TARGET_H signal path 136 or a logic low signal on signal path 204, NAND gate 202 outputs a logic high VPL_MUX_HIGH signal on VPL_MUX_HIGH signal path 124.

In response to a logic high signal on VPL_MUX_HIGH signal path 124 and a logic high signal on signal path 208, NAND gate 206 outputs a logic low signal on signal path 204. In response to a logic low signal on VPL_MUX_HIGH signal path 124 or a logic low signal on signal path 208, NAND gate 206 outputs a logic high signal on signal path 204. Inverter 210 inverts the VPL_START signal on VPL_START signal path 212 to provide the signal on signal path 208.

In operation, the VPL_START signal on VPL_START signal path 212 is transitioned from a logic low to a logic high to initiate the power-up of DRAM 10. With the VPL_START signal logic high and the VPL_ON_TARGET_H signal logic low, the VPL_MUX_HIGH signal is logic high. With the VPL_ON_TARGET_H signal logic high and the VPL_START signal logic high, the VPL_MUX_HIGH signal is logic low.

Figure 6:
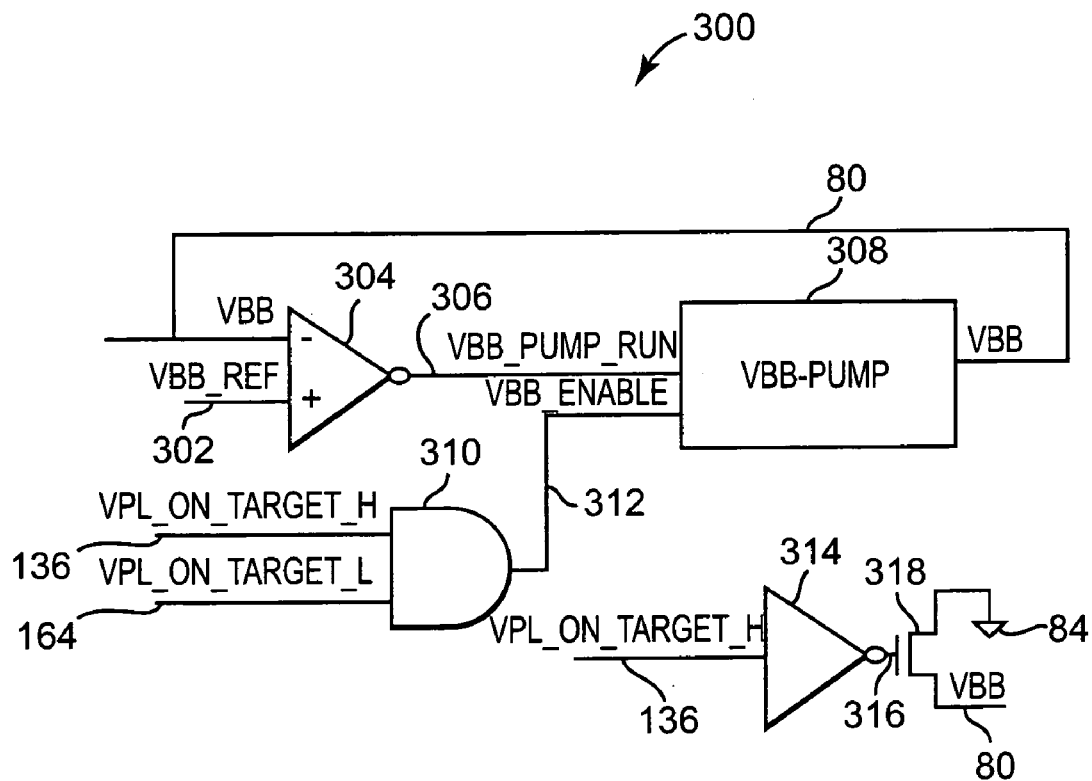
FIG. 6 is a diagram illustrating one embodiment of a voltage pump circuit.

FIG. 6 is a diagram illustrating one embodiment of a voltage pump circuit 300. In one embodiment, voltage pump circuit 300 is part of memory controller 20. Although voltage pump circuit 300 is illustrated with respect to VBB, a circuit similar to voltage pump circuit 300 is used to pump VNWLL. Voltage pump circuit 300 includes inverting comparator 304, VBB PUMP 308, AND gate 310, inverter 314, and transistor 318.

A first input of AND gate 310 receives the VPL_ON_TARGET_H signal on VPL_ON_TARGET_H signal path 136. A second input of AND gate 310 receives the VPL_ON_TARGET_L signal on VPL_ON_TARGET_L signal path 164. The output of AND gate 310 is electrically coupled to the enable input of VBB PUMP 308 through VBB_ENABLE signal path 312. The output of VBB PUMP 308 is electrically coupled to the negative input of inverting comparator 304 through VBB signal path 80. The positive input of inverting comparator 304 receives the VBB reference (VBB_REF) signal on VBB_REF signal path 302. The output of inverting comparator 304 is electrically coupled to the run input of VBB PUMP 308 through VBB_PUMP_RUN signal path 306.

The input of inverter 314 receives the VPL_ON_TARGET_H signal on VPL_ON_TARGET_H signal path 136. The output of inverter 314 is electrically coupled to the gate of transistor 318 through signal path 316. The drain-source path of transistor 318 is electrically coupled to ground 84 and VBB signal path 80.

Inverter 314 inverts the VPL_ON_TARGET_H signal on VPL_ON_TARGET_H signal path 136 to provide the signal on signal path 316. In one embodiment, transistor 318 is an n-channel metal-oxide-semiconductor field effect transistor or other suitable transistor. In response to a logic high signal on signal path 316, transistor 318 turns on to tie the VBB signal on VBB signal path 80 to ground 84. In response to a logic low signal on signal path 316, transistor 318 turns off to float the VBB signal on VBB signal path 80 if the VBB_ENABLE signal is logic low.

AND gate 310 receives the VPL_ON_TARGET_H signal on VPL_ON_TARGET_H signal path 136 and the VPL_ON_TARGET_L signal on VPL_ON_TARGET_L signal path 164 to provide the VBB_ENABLE signal on VBB_ENABLE signal path 312. In response a logic high VPL_ON_TARGET_H signal and a logic high VPL_ON_TARGET_L signal, AND gate 310 outputs a logic high VBB_ENABLE signal. In response to a logic low VPL_ON_TARGET_H signal or a logic low VPL_ON_TARGET_L signal, AND gate 310 outputs a logic low VBB_ENABLE signal.

VBB_PUMP 308 receives the VBB_PUMP_RUN signal on VBB_PUMP_RUN signal path 306 and the VBB_ENABLE signal on VBB_ENABLE signal path 312 to provide the VBB signal on VBB signal path 80. In response to a logic low VBB_ENABLE signal, VBB PUMP 308 is disabled. In response to a logic high VBB_ENABLE signal, VBB PUMP 308 is enabled. In response to a logic high VBB_ENABLE signal and a logic low VBB_PUMP_RUN signal, VBB PUMP 308 does not pump the VBB signal. In response to a logic high VBB_ENABLE signal and a logic high VBB_PUMP_RUN signal, VBB PUMP 308 pumps the VBB signal to lower the VBB signal.

Inverting comparator 304 receives the VBB signal on VBB signal path 80 and the VBB_REF signal on VBB_REF signal path 302 to provide the VBB_PUMP_RUN signal on VBB_PUMP RUN signal path 306. In response to the VBB signal being greater than the VBB_REF signal, inverting comparator 304 outputs a logic high VBB_PUMP_RUN signal. In response to the VBB signal being less than the VBB_REF signal, inverting comparator 304 outputs a logic low VBB_PUMP_RUN signal.

In operation, with the VPL_ON_TARGET_H signal or the VPL_ON_TARGET_L signal logic low, VBB PUMP 308 is disabled. With the VPL_ON_TARGET_H signal logic low, the VBB signal is tied to ground. With the VPL_ON_TARGET_H signal logic high and the VPL_ON_TARGET_L signal logic low, the VBB signal is floated to lower the VBB signal with the VPL signal through parasitic coupling capacitance 96. With both the VPL_ON_TARGET_H signal logic high and the VPL_ON_TARGET_L signal logic high, VBB PUMP 308 is enabled to pump the VBB signal to reduce the VBB signal to VBB_REF. With the VBB signal less than the VBB_REF signal, VBB PUMP 308 stops pumping.

Figure 7:
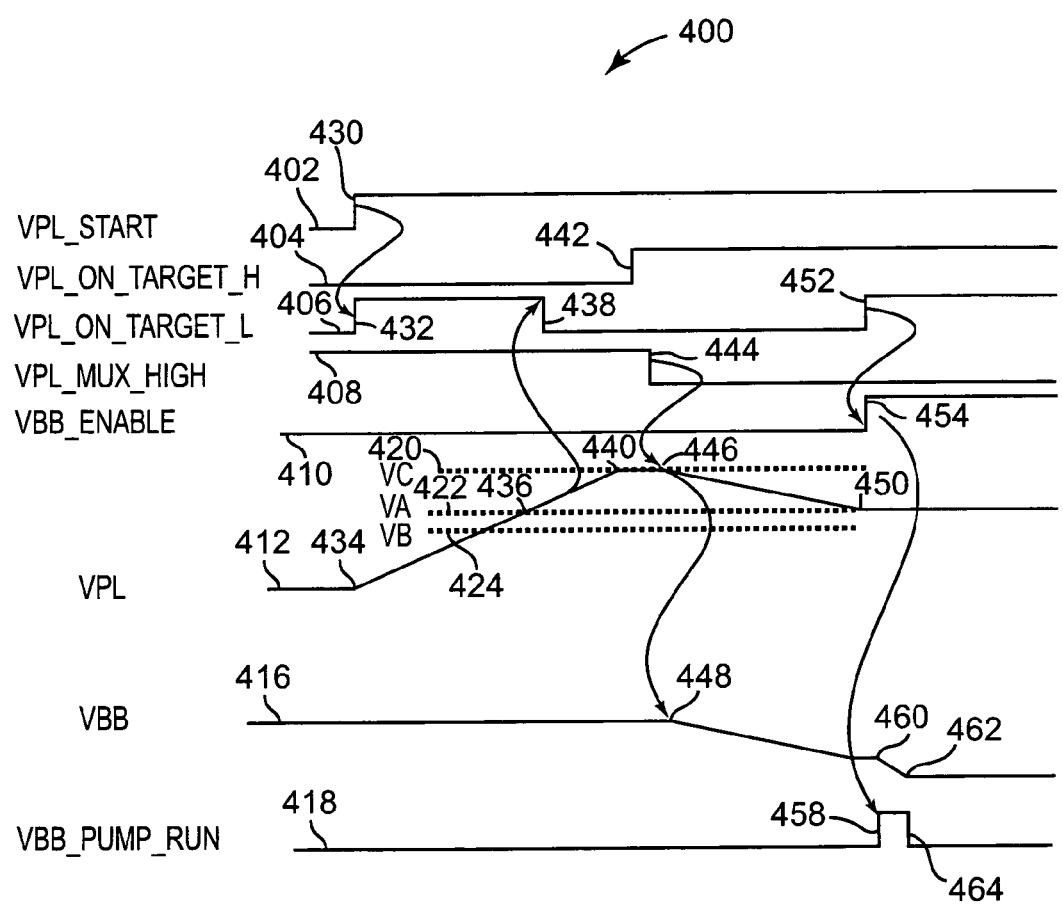
FIG. 7 is a timing diagram illustrating one embodiment of the timing of signals for the voltage driver circuit, control circuit, and voltage pump circuit.

FIG. 7 is a timing diagram 400 illustrating one embodiment of the timing of signals for voltage driver circuit 100, control circuit 200, and voltage pump circuit 300. Although timing diagram 400 illustrates VPL signal 412 and VBB signal 416, a similar timing diagram applies to VBLEQ and VNWLL. Timing diagram 400 includes VPL_START signal 402 on VPL_START signal path 212, VPL_ON_TARGET_H signal 404 on VPL_ON_TARGET_H signal path 136, VPL_ON_TARGET_L signal 406 on VPL_ON_TAR- GET_L signal path 164, VPL_MUX_HIGH signal 408 on VPL_MUX_HIGH signal path 124, VBB_ENABLE signal 410 on VBB_ENABLE signal path 312, VC signal 420 on VC signal path 118, VA signal 422 on VA signal path 108, VB signal 424 on VB signal path 112, VPL signal 412 on VPL signal path 82, VBB signal 416 on VBB signal path 80, and VBB_PUMP_RUN signal 418 on VBB_PUMP_RUN signal path 306.

Rising edge 430 of VPL_START signal 402 initiates the power-up of DRAM 10. With VPL_ON_TARGET_H logic low, VBB signal 416 is tied to ground. In response to rising edge 430 of VPL_START signal 402, VPL_ON_TARGET_L signal 406 transitions to logic high at 432 with VPL signal 412 less than VA signal 422. In response to rising edge 430 of VPL_START signal 402, VPL driver circuit 100 is enabled to raise VPL signal 412 at 434. In response to VPL signal 412 rising above VA signal 422 at 436, VPL_ON_TARGET_L signal 406 transitions to logic low at 438. In response to VPL signal 412 rising above VC signal 420 at 440, VPL_ON_TARGET_H signal 404 transitions to logic high at 442.

In response to rising edge 442 of VPL_ON_TARGET_H signal 404, VPL_MUX_HIGH signal 408 transitions to logic low at 444. In response to falling edge 444 of VPL_MUX_HIGH signal 408, VPL driver circuit 100 lowers VPL signal 412 at 446. Also in response to falling edge 444 of VPL_MUX_HIGH signal 408, voltage pump circuit 300 unties VBB signal 416 at 448 to float VBB signal 416, which lowers VBB signal 416 with VPL signal 412 through parasitic coupling capacitance 96. In response to VPL signal 412 falling below VA signal 422 at 450, VPL_ON_TARGET_L signal 406 transitions to logic high at 452. In response to rising edge 452 of VPL_ON_TARGET_L signal 406, VBB_ENABLE signal 410 transitions to logic high at 454.

In response to rising edge 454 of VBB_ENABLE signal 410, VBB_PUMP_RUN signal 418 transitions to logic high at 458. In response to rising edge 458 of VBB_PUMP_RUN signal 418, VBB PUMP 308 pumps VBB signal to lower VBB signal 416 at 460. In response to VBB signal 416 falling below the VBB_REF signal at 462, VBB_PUMP_RUN signal 418 transitions to logic low at 464. In response to falling edge 464 of VBB_PUMP_RUN signal 418, VBB PUMP 308 stops pumping VBB signal 416 to maintain VBB signal 418 at the VBB_REF voltage. In one embodiment, the time VBB_PUMP_RUN signal 418 is logic high to run VBB PUMP 308 is adjusted by adjusting the voltage for VC signal 420.

Embodiments of the present invention use the parasitic coupling capacitances within the memory cells to pump the DRAM voltages to the desired levels. The DRAM voltages reach the desired levels efficiently and quickly within the standard time frame (200 μs for commodity DRAM, 150 μs for CellularRAM) allotted for powering up a DRAM. In addition, embodiments of the present invention enable the size and/or number of VBB pumps to be reduced and enable the elimination of discharge devices typically used to limit any potential increase of VBB or VNWLL.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory comprising:
   a power-up circuit configured to:
   increase a first voltage to a first value with a second voltage tied to ground;
   reduce the first voltage from the first value to a second value with the second voltage floating to reduce the second voltage through a parasitic coupling capacitance; and
   pump the second voltage to reduce the second voltage to a third value with the first voltage less than the second value.

2. The memory of claim 1, wherein the first voltage comprises a memory cell capacitor plate voltage.

3. The memory of claim 1, wherein the first voltage comprises a bit line equalization voltage.

4. The memory of claim 1, wherein the second voltage comprises a memory cell transistor back bias voltage.

5. The memory of claim 1, wherein the second voltage comprises a negative word line low voltage.

6. The memory of claim 1, wherein the parasitic coupling capacitance comprises a parasitic coupling capacitance between a memory cell transistor back bias voltage signal path and a memory cell capacitor plate voltage signal path.

7. The memory of claim 1, wherein the parasitic coupling capacitance comprises a parasitic coupling capacitance between a memory cell transistor back bias voltage signal path and a bit line.

8. The memory of claim 1, wherein the parasitic coupling capacitance comprises a parasitic coupling capacitance between a word line and a bit line.

9. A power-up circuit for use with a dynamic random access memory comprising:
   a parasitic coupling capacitance between a first signal path and a second signal path; and
   a voltage driver circuit configured to raise a first voltage on the first signal path above a first target voltage with a second voltage on the second signal path tied to ground, and lower the first voltage to the first target voltage with the second voltage floating to lower the second voltage to a second target voltage through the parasitic coupling capacitance.

10. The circuit of claim 9, further comprising:
    a voltage pumping circuit configured to lower the second voltage to a third target voltage with the first voltage less than the first target voltage.

11. The circuit of claim 9, wherein the first voltage comprises one of a memory cell capacitor plate voltage and a bit line equalization voltage.

12. The circuit of claim 9, wherein the second voltage comprises one of a memory cell transistor back bias voltage and a negative word line low voltage.

13. The circuit of claim 9, wherein the first signal path comprises one of a memory cell capacitor plate voltage signal path and a bit line.

14. The circuit of claim 9, wherein the second signal path comprises one of a memory cell transistor back bias signal path and a word line.

15. A voltage generator circuit for use with a memory comprising:
    a voltage driver circuit configured to increase a first voltage from zero to a first value in response to a first signal and decrease the first voltage to a second value in response to a second signal, the first value greater than the second value;
    a control circuit configured to provide the second signal in response to the first voltage reaching the first value; and a voltage pump circuit configured to tie a second voltage to ground with the first voltage increasing from zero to the first value, float the second voltage with the first voltage decreasing from the first value to the second value, and pump the second voltage to a fourth value with the first voltage less than the second value, wherein a signal path of the second voltage is coupled to a signal path of the first voltage through a parasitic coupling capacitance.

16. The circuit of claim 15, wherein the first voltage comprises one of a memory cell capacitor plate voltage and a bit line equalization voltage.

17. The circuit of claim 15, wherein the second voltage comprises one of a memory cell transistor back bias voltage and a negative word line low voltage.

18. The circuit of claim 15, further comprising:

a second voltage pump circuit configured to tie a third voltage to ground with the first voltage increasing from zero to the first value, float the third voltage with the first voltage decreasing from the first value to the second value, and pump the third voltage to a fifth value less than the fourth value with the first voltage less than the second value, wherein a signal path of the third voltage is coupled to a signal path of the first voltage through a parasitic coupling capacitance.

19. The circuit of claim 18, wherein the first voltage comprises a memory cell capacitor plate voltage and a bit line equalization voltage, the second voltage comprises a memory cell transistor back bias voltage, and the third voltage comprises a negative word line low voltage.

20. A voltage initialization circuit for use with a memory comprising:

means for increasing a first voltage to a first value with a second voltage tied to ground;

means for reducing the first voltage from the first value to a second value with the second voltage floating to reduce the second voltage through a parasitic coupling capacitance; and means for pumping the second voltage to reduce the second voltage to a third value with the first voltage less than the second value.

21. A method for initializing voltages in memory, the method comprising:

increasing a first voltage to a first value with a second voltage tied to ground;

reducing the first voltage from the first value to a second value with the second voltage floating to reduce the second voltage through a parasitic coupling capacitance; and pumping the second voltage to reduce the second voltage to a third value with the first voltage less than the second value.

22. The method of claim 21, wherein increasing the first voltage comprises increasing a memory cell capacitor plate voltage.

23. The method of claim 21, wherein increasing the first voltage comprises increasing a bit line equalization voltage.

24. The method of claim 21, wherein reducing the second voltage comprises reducing a memory cell transistor back bias voltage.

25. The method of claim 21, wherein reducing the second voltage comprises reducing a negative word line low voltage.

26. The method of claim 21, wherein reducing the second voltage through the parasitic coupling capacitance comprises reducing the second voltage through a parasitic coupling capacitance between a memory cell transistor back bias voltage signal path and a memory cell capacitor plate voltage signal path.

27. The method of claim 21, wherein reducing the second voltage through the parasitic coupling capacitance comprises reducing the second voltage through a parasitic coupling capacitance between a memory cell transistor back bias voltage signal path and a bit line.

28. The method of claim 21, wherein reducing the second voltage through the parasitic coupling capacitance comprises reducing the second voltage through a parasitic coupling capacitance between a bit line and a word line.

29. A method for powering up a dynamic random access memory, the method comprising:

providing a first signal to initiate a power-up of a dynamic random access memory;

raising a first voltage from zero to a first target value in response to the first signal with a second voltage tied to ground;

providing a second signal in response to the first voltage reaching the first target value;

floating the second voltage and reducing the first voltage to a second target value in response to the second signal to reduce the second voltage to a third target value through a parasitic coupling capacitance between a signal path of the first voltage and a signal path of the second voltage;

providing a third signal in response to the first voltage reaching the second target value; and pumping the second voltage to reduce the second voltage to a fourth target value in response to the third signal.

30. The method of claim 29, wherein raising the first voltage comprises raising one of a memory cell capacitor plate voltage and a bit line equalization voltage.

31. The method of claim 29, wherein reducing the second voltage comprises reducing one of a memory cell transistor back bias voltage and a negative word line low voltage.

32. A method for charging a parasitic coupling capacitor network in a memory cell, the method comprising:

tying a memory cell transistor back bias voltage and a negative word line low voltage to ground;

raising a memory cell capacitor plate voltage and a bit line equalization voltage to a first value;

floating the back bias voltage and the negative word line low voltage in response to the plate voltage and the bit line equalization voltage rising above a first value;

reducing the plate voltage and the bit line equalization voltage to a second value to reduce the back bias voltage to a third value through a first parasitic coupling capacitance between a memory cell transistor back bias voltage signal path and a memory cell capacitor plate voltage signal path and a second parasitic coupling capacitance between the memory cell transistor back bias voltage signal path and a bit line, and for reducing the negative word line low voltage through a third parasitic coupling capacitance between a word line and the bit line; and pumping the back bias voltage to a fourth value and pumping the negative word line low voltage to a fifth value in response to the plate voltage and the bit line equalization voltage falling below the second value.

* * * * *